(12) United States Patent
Cariello (10) Patent No.: US 11,189,359 B1
(45) Date of Patent: Nov. 30, 2021

(54) TECHNIQUES FOR DATA PROGRAMMING (71) Applicant: Micron Technology, Inc., Boise, ID (US)

(72) Inventor: Giuseppe Cariello, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/916,952

(22) Filed: Jun. 30, 2020

(51) Int. Cl.
| G11C 16/10 | (2006.01) |
| G11C 29/44 | (2006.01) |
| G11C 29/46 | (2006.01) |
| G11C 29/14 | (2006.01) |
| G11C 16/26 | (2006.01) |
| G11C 16/30 | (2006.01) |

(52) U.S. Cl.
CPC .............. *G11C 29/44* (2013.01); *G11C 16/10* (2013.01); *G11C 16/26* (2013.01); *G11C 16/30* (2013.01); *G11C 29/14* (2013.01); *G11C 29/46* (2013.01); *G11C 2029/4402* (2013.01)

(58) Field of Classification Search
CPC ......... G11C 29/44; G11C 16/10; G11C 16/26; G11C 16/30; G11C 29/14; G11C 29/46
USPC ........................................................ 365/201
See application file for complete search history.

(56) References Cited

U.S. PATENT DOCUMENTS

| 10,090,044 B2* | 10/2018 | Achtenberg | ........ G11C 11/5628 |
| 2013/0128671 A1* | 5/2013 | Shin | ........................ G11C 16/06 365/185.18 |
| 2018/0025776 A1* | 1/2018 | Achtenberg | ........... G11C 16/10 714/764 |

* cited by examiner

*Primary Examiner* — Xiaochun L Chen
(74) *Attorney, Agent, or Firm* — Holland & Hart LLP (57) ABSTRACT

Methods, systems, and devices for techniques for data programming are described for programming data to a memory system using a second programming mode associated with a higher error rate than a first programming mode. The second programming mode may include skipping one or more voltage calibration procedures included in the first programming mode, as well as performing one or more data verification procedures once a larger set of the data is programmed. The second programming mode may also include using a higher programming voltage pulse to program data and the programming pulse may last for a longer period of time than a programming pulse for the first programming mode. A memory system may receive data, determine to write the data to a memory device using the second programming mode, write the data using the second programming mode, and verify whether the data satisfies an error threshold.

20 Claims, 6 Drawing Sheets

TECHNIQUES FOR DATA PROGRAMMING

BACKGROUND

The following relates generally to one or more systems for memory and more specifically to techniques for data programming.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D Xpoint), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Some data may be programmed to a memory device (e.g., a not-AND (NAND) memory device) and may be verified with a dedicated read or verify command. Verifying the programmed data may include verifying each bit of the programmed data (e.g., during a voltage calibration process), for example, after writing the bit of data. If the bit of data fails the verification process, the bit may be rewritten and re-verified until passing the verification. These techniques for programming data may represent examples of a first programming mode (e.g., a normal programming mode) and may result in a first error rate for the programmed data (e.g., a lower error rate for the programmed data). Due to the verification and/or calibration processes associated with the first programming mode, the first programming mode may result in a lower error rate for the programmed data, but may also use a higher amount of power and a higher amount of time to program the data.

The present disclosure provides techniques for programming data using a second programming mode (e.g., instead of the first programming mode). Some examples of the second programming mode may include skipping the voltage calibration procedure included in the first programming mode. The second programming mode may additionally skip verification procedures until some or all the scheduled data is programmed to the memory device and may, for example, perform a data verification procedure once some or all the data is programmed. The second programming mode may also include performing a higher programming voltage pulse to program data (e.g., program logical '0' values), where the programming pulse may last for a longer period of time than a programming pulse from the first programming mode.

The second programming mode may result in a second error rate for the programmed data (e.g., a higher error rate for the programmed data), but may use a lower amount of power and may take less time to program the data. Thus, programming data using the second programming mode may reduce costs and improve programming processes, for example, during in-system-programming (e.g., loading an operating system, one or more applications, and/or data on embedded storage during manufacturing of electronic devices) or during streaming, among other examples.

Features of the disclosure are initially described in the context of systems and dies as described with reference to FIG. 1. Features of the disclosure are described in the context a programming distribution and flow diagrams as described with reference to FIGS. 2-4. These and other features of the disclosure are further illustrated by and described with reference to an apparatus diagram and flow-charts that relate to techniques for data programming as described with reference to FIGS. 5 and 6.

Figure 1:
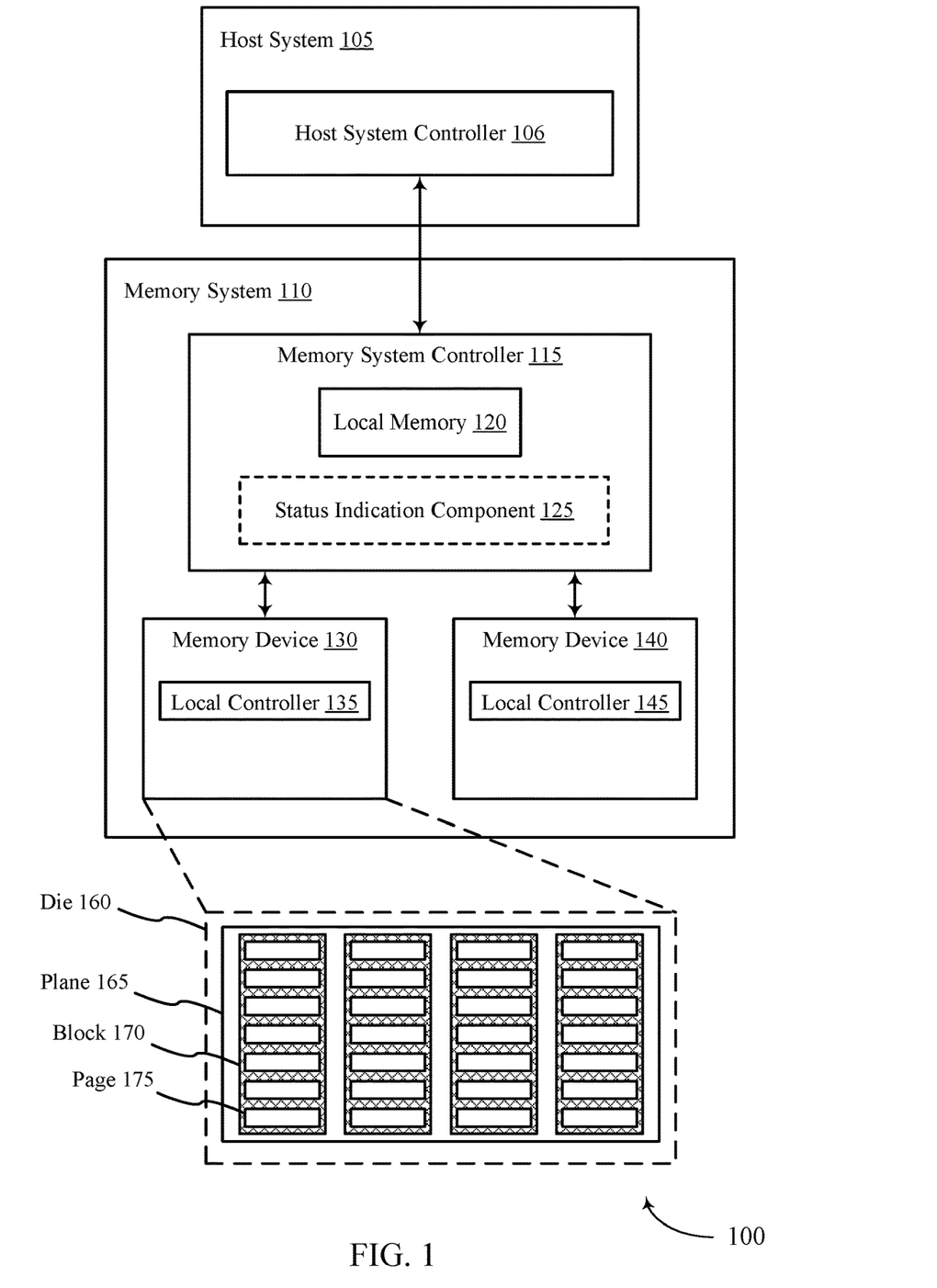
FIG. 1 illustrates an example of a system that supports techniques for data programming in accordance with examples as disclosed herein.

FIG. 1 illustrates an example of a system 100 that supports techniques for data programming in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., PCIe controller, SATA controller). The host system 105 may use the memory system 110, for example, to write data to the memory system 110 and read data from the memory system 110. Although one memory system 110 is shown in FIG. 1, it is to be understood that the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a serial advanced technology attachment (SATA) interface, a UFS interface, an eMMC interface, a peripheral component interconnect express (PCIe) interface, USB interface, Fiber Channel, Small Computer System Interface (SCSI), Serial Attached SCSI (SAS), Double Data Rate (DDR), a dual in-line memory module (DIMM) interface (e.g., DIMM socket interface that supports DDR), Open NAND Flash Interface (ONFI), Low Power Double Data Rate (LPDDR). In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 or memory device 140 included in the memory system 110, or via a respective physical host interface for each type of memory device 130 or memory device 140 included in the memory system 110.

Memory system 110 may include a memory system controller 115, a memory device 130, and a memory device 140. A memory device 130 may include one or more memory arrays of a first type of memory cells (e.g., a type of non-volatile memory cells), and a memory device 140 may include one or more memory arrays of a second type of memory cells (e.g., a type of volatile memory cells). Although one memory device 130 and one memory device 140 are shown in the example of FIG. 1, it is to be understood that memory system 110 may include any quantity of memory devices 130 and memory devices 140, and that, in some cases, memory system 110 may lack either a memory device 130 or a memory device 140.

The memory system controller 115 may be coupled with and communicate with the host system 105 (e.g., via the physical host interface). The memory system controller 115 may also be coupled with and communicate with memory devices 130 or memory devices 140 to perform operations such as reading data, writing data, erasing data, or refreshing data at a memory device 130 or a memory device 140, and other such operations, which may generically be referred to as access operations. In some cases, the memory system controller 115 may receive commands from the host system 105 and communicate with one or more memory devices 130 or memory devices 140 to execute such commands (e.g., at memory arrays within the one or more memory devices 130 or memory devices 140). For example, the memory system controller 115 may receive commands or operations from the host system 105 and may convert the commands or operations into instructions or appropriate commands to achieve the desired access of the memory devices 130 or memory devices 140. And in some cases, the memory system controller 115 may exchange data with the host system 105 and with one or more memory devices 130 or memory devices 140 (e.g., in response to or otherwise in association with commands from the host system 105). For example, the memory system controller 115 may convert responses (e.g., data packets or other signals) associated with the memory devices 130 or memory devices 140 into corresponding signals for the host system 105.

The memory system controller 115 may be configured for other operations associated with the memory devices 130 or memory devices 140. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130 or memory devices 140.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored to the local memory 120 when read from or written to a memory device 130 or memory device 140, and may be available within the local memory 120 for subsequent retrieval for or manipulation (e.g., updating) by the host system 105 (e.g., with reduced latency relative to a memory device 130 or memory device 140) in accordance with a cache policy.

Although the example of memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135 or local controllers 145, which may be internal to memory devices 130 or memory devices 140, respectively, to perform the functions ascribed herein to the memory system controller 115. In general, one or more functions ascribed herein to the memory system controller 115 may in some cases instead be performed by the host system 105, a local controller 135, or a local controller 145, or any combination thereof.

A memory device 140 may include one or more arrays of volatile memory cells. For example, a memory device 140 may include random access memory (RAM) memory cells, such as dynamic RAM (DRAM) memory cells and synchronous DRAM (SDRAM) memory cells. In some examples, a memory device 140 may support random access operations (e.g., by the host system 105) with reduced latency relative to a memory device 130, or may offer one or more other performance differences relative to a memory device 130.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric RAM (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), and electrically erasable programmable ROM (EEPROM).

In some examples, a memory device 130 or a memory device 140 may include (e.g., on a same die or within a same package) a local controller 135 or a local controller 145, respectively, which may execute operations on one or more memory cells of the memory device 130 or the memory device 140. A local controller 135 or a local controller 145 may operate in conjunction with a memory system controller 115 or may perform one or more functions ascribed herein to the memory system controller 115. In some cases, a memory device 130 or a memory device 140 that includes a local controller 135 or a local controller 145 may be referred to as a managed memory device and may include a memory array and related circuitry combined with a local (e.g., on-die or in-package) controller (e.g., local controller 135 or local controller 145). An example of a managed memory device is a managed NAND (MNAND) device.

In some cases, a memory device 130 may be or include a NAND device (e.g., NAND flash device). The memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

Figure 3:
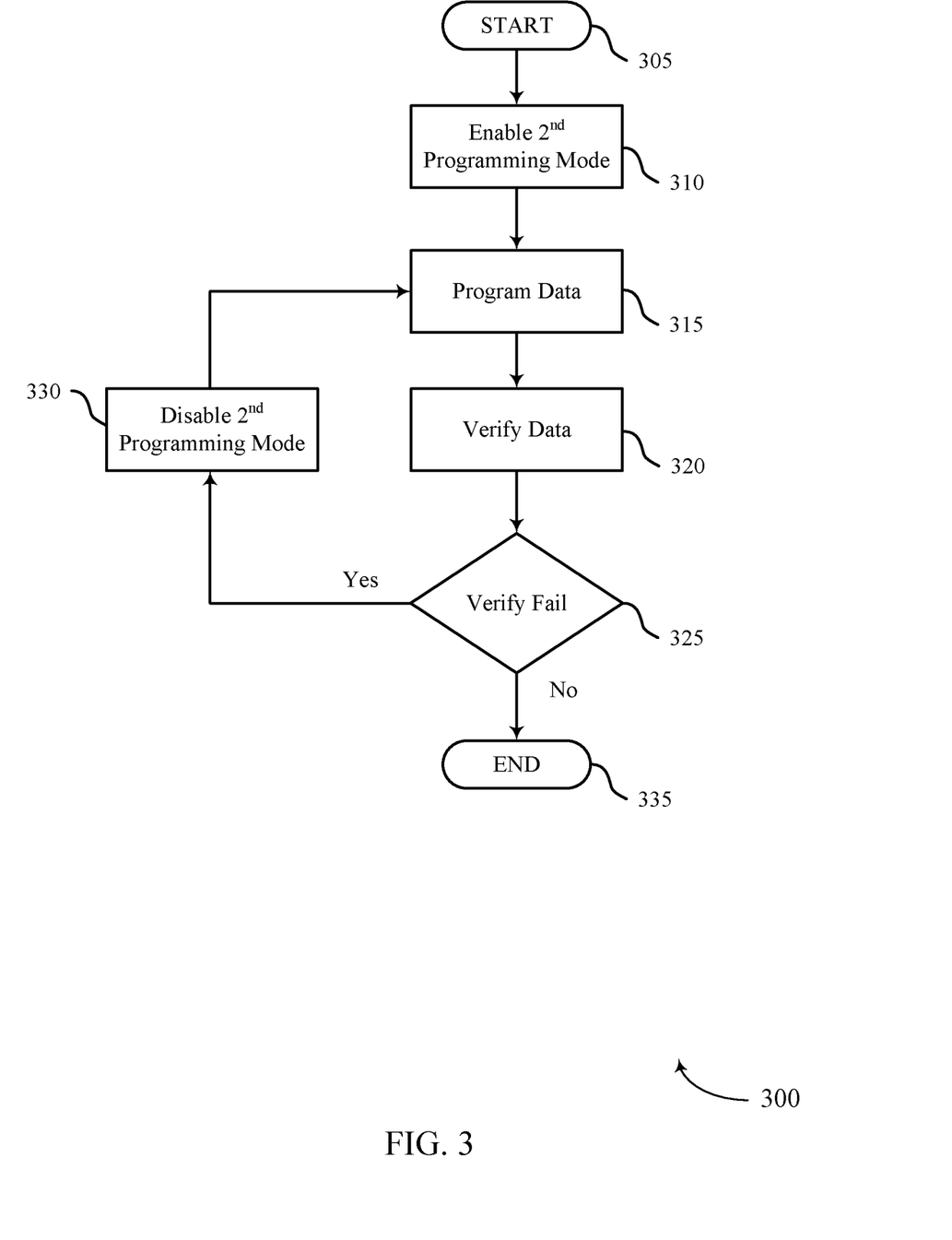
FIG. 3 illustrates an example of a flow diagram that supports techniques for data programming in accordance with examples as disclosed herein.
Figure 4:
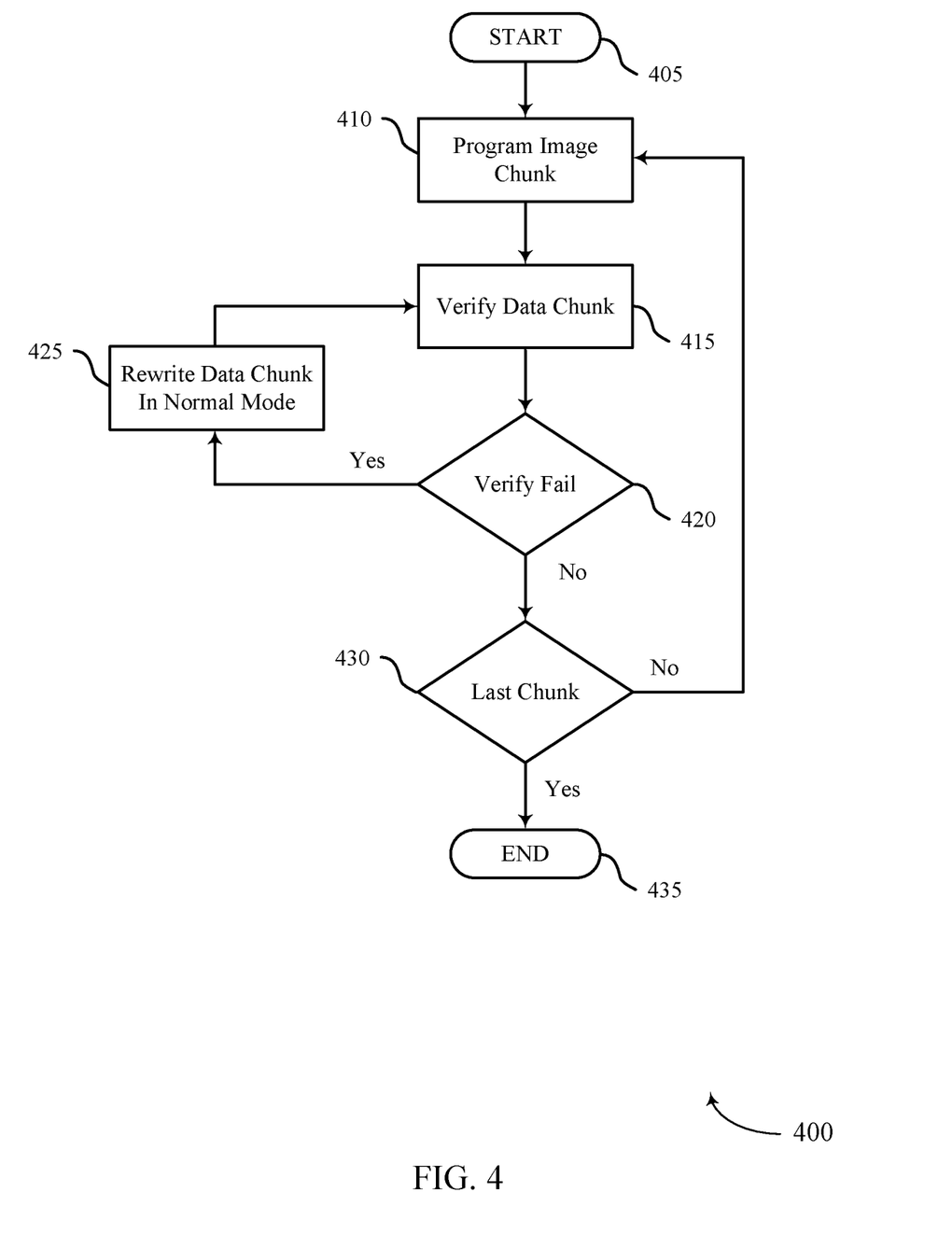
FIG. 4 illustrates an example of a flow diagram that supports techniques for data programming in accordance with examples as disclosed herein.

The system 100 may include any quantity of non-transitory computer readable media that support techniques for data programming. For example, the host system 105, the memory system controller 115, a memory device 130, or a memory device 140 may include or otherwise may access one or more non-transitory computer readable media storing instructions (e.g., firmware) for performing the functions ascribed herein to the host system 105, memory system controller 115, memory device 130, or memory device 140. For example, such instructions, when executed by the host system 105 (e.g., by the host system controller 106), by the memory system controller 115, by a memory device 130 (e.g., by a local controller 135), or by a memory device 140 (e.g., by a local controller 145), may cause the host system 105, memory system controller 115, memory device 130, or memory device 140 to perform associated functions as described herein (e.g., flow diagrams 300 and 400).

Figure 2:
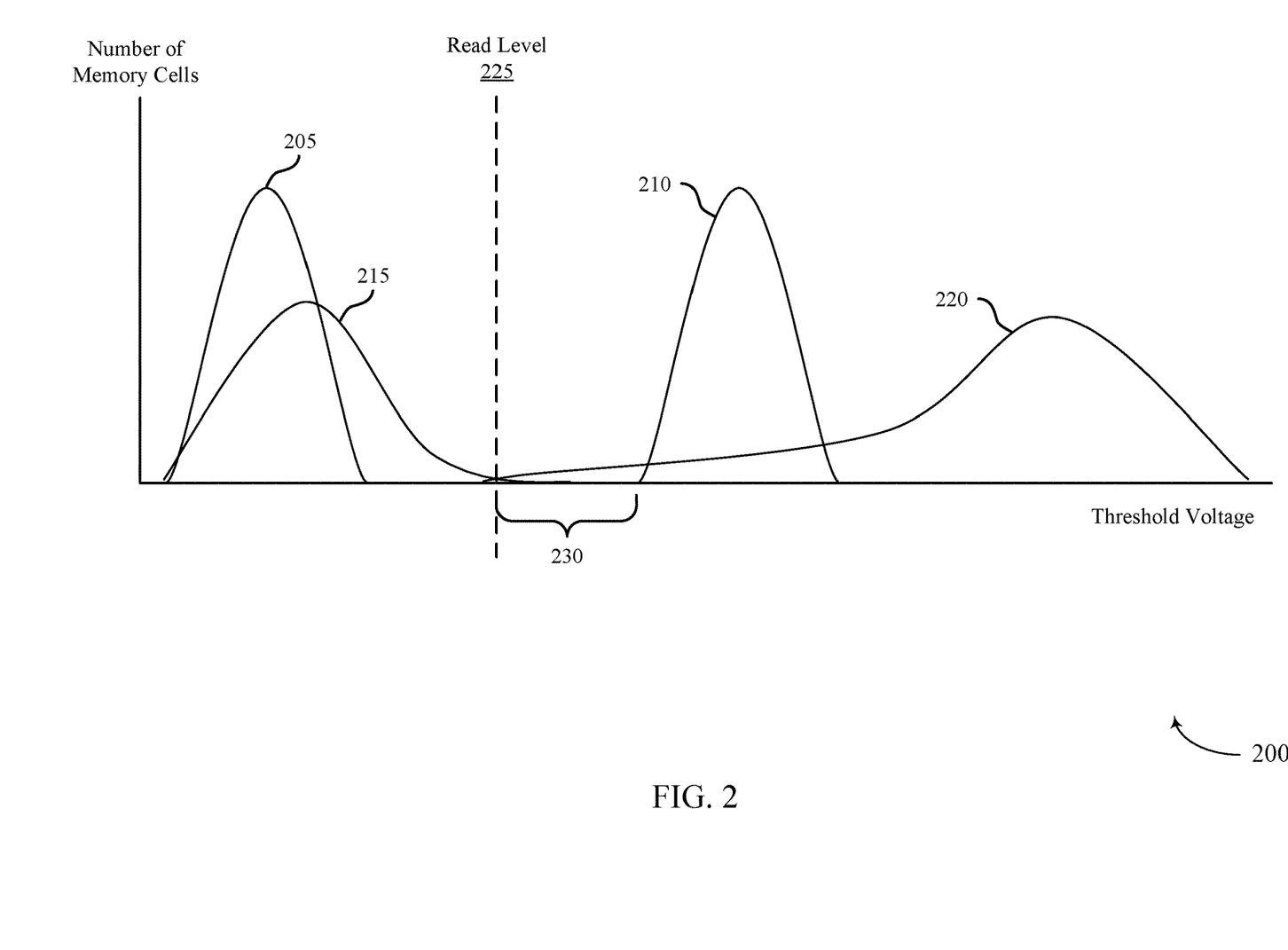
FIG. 2 illustrates an example of a programming distribution that supports techniques for data programming in accordance with examples as disclosed herein.

FIG. 2 illustrates an example of a programming distribution 200 that supports techniques for data programming in accordance with examples as disclosed herein. For example, programming distribution 200 may illustrate distributions of threshold voltages for memory cells associated with a first programming mode (e.g., a normal programming mode) and a second programming mode (e.g., a modified, blind, or unreliable programming mode). Distributions 205 and 210, for example, may correspond to threshold voltage distributions for memory cells programmed using the first programming mode, while distributions 215 and 220 may correspond to threshold voltage distributions for memory cells programmed using the second programming mode. In some cases, distributions 205 and 215 may correspond to threshold voltage distributions of memory cells programmed to a logical value of '1' and distributions 210 and 220 may correspond to threshold voltage distributions of memory cells programmed to a logical value of '0.'

Some memory device programming operations (e.g., NAND programming operations) may not be fully reliable because the programming operations may verify programmed memory cells until the memory cells reach a requested threshold voltage. For example, in some conditions (e.g., voltage spikes, defect activation) the programming operations may determine that a status of the programmed memory cells is good when the programmed data may be corrupted.

In order to avoid corruption of programmed data (e.g., a programmed image), the programmed data may be verified with a dedicated read or verify command, for example, during an in-systems-programming operation of a manufacturing cycle during which an operating system and other preloaded applications may be written to a memory device (e.g., a NAND device, such as a managed NAND (MNAND) device). Verifying the programmed data may include verifying each bit of the programmed data, for example, after writing the bit of data. If the bit of data fails the verification process, the bit may be rewritten and re-verified until passing the verification. These techniques for programming data may represent examples of the first programming mode and may result in a first error rate for the programmed data (e.g., a lower error rate for the programmed data).

In some examples of the first programming mode, SLC programming may include a voltage calibration procedure on a word line group followed by a programming pulse. For example, the memory device may perform a starting voltage calibration on a first page of a word line, while performing one or two programming pulses on other pages of the same word line (e.g., using feedback information from the voltage calibration). The voltage calibration may, for example, include performing bit-by-bit verification of written data, as described herein. In some cases, the one or two programming pulses on the other pages of the word line may omit the bit-by-bit verification operation, or may include modified verification processes.

Performing data programming according to the examples of the first programming mode described herein may result in distributions 205 and 210, where distribution 205 may represent threshold voltages of memory cells having programmed logical values of '1' and distribution 210 may represent threshold voltages of memory cells having programmed logical values of '0.' Programming data using the first programming mode may additionally result in tighter or smaller distributions 205 and 210, where distributions 205 and 210 may be located within a voltage gap 230 between outlying threshold voltages of the distributions 205 and 210 and a voltage read level 225.

In some cases, the second programming mode may be used (e.g., instead of the first programming mode) for programming data to the memory device. Some examples of the second programming mode may include skipping the voltage calibration procedure included in the first programming mode. The second programming mode may additionally skip verification procedures until some or all the scheduled data is programmed to the memory device and may, for example, perform a data verification procedure once some or all the data is programmed. The second programming mode may also include performing a higher programming voltage pulse to program data (e.g., program logical '0' values), in some examples for a longer period of time than a programming pulse from the first programming mode. This higher programming pulse may support programming memory cells such that memory cells being programmed to a logical value of '0' may be placed at a threshold voltage above the read level 225.

Performing data programming according to the examples of the second programming mode described herein may result in distributions 215 and 220, where distribution 215 may represent threshold voltages of memory cells having programmed logical values of '1' and distribution 220 may represent threshold voltages of memory cells having programmed logical values of '0.' Programming data using the second programming mode may additionally result in larger distributions 215 and 220, where distributions 215 and 220 may, in some cases, overlap with voltage read level 225. The second programming mode may result in a second error rate for the programmed data (e.g., a higher error rate for the programmed data).

Due to the verification and/or calibration processes associated with the first programming mode, the first programming mode may result in a lower error rate for the programmed data, but may also use a higher amount of power and time to program the data. The second programming mode may result in a higher error rate for the programmed data, but may use a lower amount of power and time to program the data. Thus, programming data using the second programming mode may reduce costs and improve programming processes. The second error rate associated with using the second programming mode to program data to the memory device may be acceptable in some cases, for example, when performing in-system-programming in a controlled environment (e.g., having controlled ambient conditions during the second programming operation until a data refresh). In such cases, for example, some adverse effects of such programming on the memory cells of the memory device may be reduced to acceptable levels.

FIG. 3 illustrates an example of a flow diagram 300 that supports techniques for data programming in accordance with examples as disclosed herein. For example, as described with reference to FIG. 2, a memory device (e.g., including a memory array) may be configured to write or program data to the memory array using a first programming mode (e.g., a normal programming mode) or a second programming mode (e.g., a modified, unreliable, or blind programming mode). The first programming mode may include programming the data using one or more verification or writing procedures that may result in higher time and cost, as well as lower data error rates. The second programming mode may include programming the data using one or more verification or writing procedures that may result in lower time and cost, and higher data error rates (e.g., higher than data error rates associated with the first programming mode). The flow diagram 300 may represent one or more techniques for programming data using the second programming mode at the memory device.

At 305, the data programming procedure may begin. For example, the memory device may receive data to write to the memory device. In some cases, the memory device may receive the data from a source external to the memory device, such as a host device.

At 310, the second programming mode may be enabled for programming the data. For example, the memory device may determine to write the data to the memory device using the second programming mode. In some cases, the memory device may receive a command (e.g., a dedicated command, such as a write command) that includes an indication to write the data to the memory device using the second programming mode, and may determine to use the second programming mode based on the indication. In some cases, the memory device may be configured (e.g., preconfigured) to use the second programming mode and may determine to use the second programming mode based on the configuration of the memory device. For example, the memory device may be configured with a selectable second programming mode, such that a command or a configuration may activate the second programming mode. In some cases, the memory device may perform an autodetection process and may determine to use the second programming mode based on the autodetection process.

At 315, the data may be programmed or written to the memory device, using the second programming mode (e.g., based on enabling the second programming mode). For example, as described herein, the memory device may use a voltage pulse to program one or more memory cells of the memory device, where the voltage pulse may be longer or may have a voltage level higher than a voltage pulse used for the first programming mode. Similarly, the second programming mode may skip one or more verification steps associated with the first programming mode (e.g., verifying each bit programmed to the memory device) and may perform verification of some or all of the data written to the memory device after writing the data. In some cases, programming data using the second programming mode may include programming or writing at least a portion of the data to a redundant array of independent nodes (RAIN) (e.g., using a RAIN scheme or RAIN parity). For example, one parity or data backup page (e.g., as a backup in case of data corruption) may be written to the memory device for every 32 pages of data.

For example, at 320, the data written to the memory device may be verified (e.g., based on using the second programming mode). Verifying the data may include determining whether an error rate or failure rate of the data written to the memory device (e.g., all of the data). A failure rate of the programming operation may represent, for example, a ratio of memory cells failing a read verification (e.g., or other verification) compared to a total quantity of memory cells associated with the data programming. An overall failure rate may include or represent an image failure rate determined by a failure rate of the program operation (e.g., NAND program operation) and a size of the data image being programmed, where a larger image size may result in a higher image failure rate for a given program failure rate. In some cases, the verification may be initiated by a host device, for example, based on a command from the host device or using data provided by the host device.

In some cases, the memory device may include or take into account RAIN data when determining a failure rate (e.g., determining whether the data satisfies the error threshold). For example, when considering the data associated with a RAIN scheme, the failure rate of the data written using the second programming mode may be reduced for a given page failure rate (e.g., a quantity of cells per page with an incorrect value, or that fail a read or other verification). In such cases, a data value (e.g., logical memory cell value) may be considered to have failed verification if the data value is unrecoverable from the RAIN and may be considered to have passed verification if the data value is recoverable from RAIN.

At 325, it may be determined whether the data (e.g., or a portion of the data) written using the second programming mode failed the verification. For example, the memory device may determine whether the data written to the memory device (e.g., all of the data) satisfies an error threshold or a failure rate. The error threshold may represent a threshold failure rate or error rate for the data programmed using the second programming mode. If the memory device determines that the data passes verification (e.g., does not fail verification), the memory device may proceed to 335 and may terminate writing the data to the memory device (e.g., based on determining that the data satisfies the error threshold). If the memory device determines that the data fails verification, the memory device may proceed to 330.

At 330, the second programming mode may be disabled and the first programming mode may be enabled, for example, based on determining that the data or a portion of the data failed verification. The memory device may proceed to 315 and may rewrite the data using the first programming mode, such that the error rate associated with the data may be reduced. In some cases, the memory device may rewrite some or all of the data using the first programming mode, while in some cases, the memory device may rewrite the portion of the data failing verification using the first programming (e.g., and may not rewrite data written using the second programming mode and that did not fail verification) . In accordance with the first programming mode as described herein, the memory device may perform one or more verification procedures associated with the first programming mode (e.g., at 320) and may determine whether the data passes verification (e.g., at 325). If the data passes verification, the memory device may proceed to 335 and may terminate writing the data.

Writing the data to the memory device using the second programming mode may result in one or more advantages as described herein, such as reducing costs and overall programming time. For example, even if data (e.g., a portion of the data failing verification or all of the data) is rewritten using the first programming mode, the second programming mode may result in time savings that may provide an overall reduction in programming time, for example, when considering each memory device being programmed.

FIG. 4 illustrates an example of a flow diagram 400 that supports techniques for data programming in accordance with examples as disclosed herein. For example, as described with reference to FIG. 2, a memory device (e.g., including a memory device) may be configured to write or program data to the memory device using a first programming mode (e.g., a normal programming mode) or a second programming mode (e.g., a modified, unreliable, or blind programming mode). The first programming mode may include programming the data using one or more verification or writing procedures that may result in higher time and cost, as well as lower data error rates. The second programming mode may include programming the data using one or more verification or writing procedures that may result in lower time and cost, and higher data error rates (e.g., higher than data error rates associated with the first programming mode). The flow diagram 400 may represent one or more techniques for programming data using the second programming mode at the memory device.

At 405, the data programming procedure may begin. For example, the memory device may receive data to write to the memory device. In some cases, the memory device may receive the data from a source external to the memory device, such as a host device. The memory device may also enable the second programming mode for programming the data. For example, the memory device may determine to write the data to the memory device using the second programming mode according to one or more examples described herein, for example, with reference to FIG. 3.

At 410, a chunk or portion of the data may be programmed or written to the memory device, using the second programming mode (e.g., based on enabling the second programming mode). For example, as described herein with reference to FIGS. 2 and 3, the second programming mode may have one or more characteristics different than the first programming mode and may include programming RAIN data. The memory device or a host device (e.g., a source external to the memory device providing the data) may slice or divide the data into chunks or portions, for example, in order to isolate data that may be reprogrammed based on a failure or error rate. A chunk may represent any subdivision of the data, such as a block of data (e.g., a virtual block) or a multiple of a block of data (e.g., a super block). For example, a size of a chunk may be based on a block size in order to avoid corrupting pages of a chunk of data that has already been verified when programming a new chunk of data. The size of a chunk (e.g., a recommended size) may be provided by a host device to the memory device, for example, via a register of the memory device (e.g., a register in a NAND interface).

At 415, verification may be performed on the chunk of data written to the memory device (e.g., based on using the second programming mode). Verifying the chunk of the data may include methods or techniques as described herein, for example, with reference to FIGS. 2 and 3.

At 420, it may be determined whether the chunk of data written using the second programming mode failed the verification. For example, the memory device may determine whether the chunk data written to the memory device (e.g., all of the data) satisfies an error threshold or a failure rate, as described with reference to FIG. 3. If the memory device determines that the data passes verification (e.g., does not fail verification), the memory device may proceed to 430. If the memory device determines that the data fails verification, the memory device may proceed to 425.

At 425, the second programming mode may be disabled and the first programming mode may be enabled, for example, based on determining that the chunk of the data failed verification. The memory device may rewrite the chunk of the data using the first programming mode, such that the error rate associated with the chunk of the data may be reduced. In accordance with the first programming mode as described herein, the memory device may perform one or more verification procedures associated with the first programming mode (e.g., at 415) and may determine whether the chunk of the data passes verification (e.g., at 420). If the chunk of the data passes verification, the memory device may proceed to 430.

At 430, it may be determined whether the chunk of the data written to the memory device is the last chunk of data, or whether there are one or more other chunks of data to be written to the memory device. If the memory device determines that there are one or more other chunks of data to be written to the memory device, the memory device may proceed to 410 and may program a next (e.g., second) chunk of the data. Programming the next chunk of the data may include performing similar steps to programming the chunk of the data. If the first chunk of data starts on an empty block of the memory device, the alignment of the data programming of following chunks of the data may be automatically calibrated, for example, based on a recommended chunk size.

At 435, writing the data may be terminated if each of the chunks of the data has been written to the memory device and has passed verification (e.g., using either the second or the first programming mode).

In some cases, the memory device may use the second programming mode to write data for in-system-programming, as described herein. In some cases, the memory device may use the second programming mode to write data during usage of a host device that may include the memory device (e.g., during usage of the memory device). Some applications may store data for shorter periods of time, such as during streaming. In such cases, if the second programming mode does not cause wear out of the memory cells of the memory device, the memory device may use the second programming mode to decrease programming time and associated latency.

Writing the data to the memory device using the second programming mode may result in one or more advantages as described herein. Writing chunks of the data may provide further advantages, such that the memory device may rewrite data using the first programming mode on a chunk-by-chunk basis (e.g., based on corresponding chunk failure or error rates), for example, instead of rewriting all of the data using the first programming mode. Writing the data on a chunk-by-chunk basis may thus further save time and resources that may otherwise be used to reprogram larger amounts of data using the first programming mode.

Figure 5:
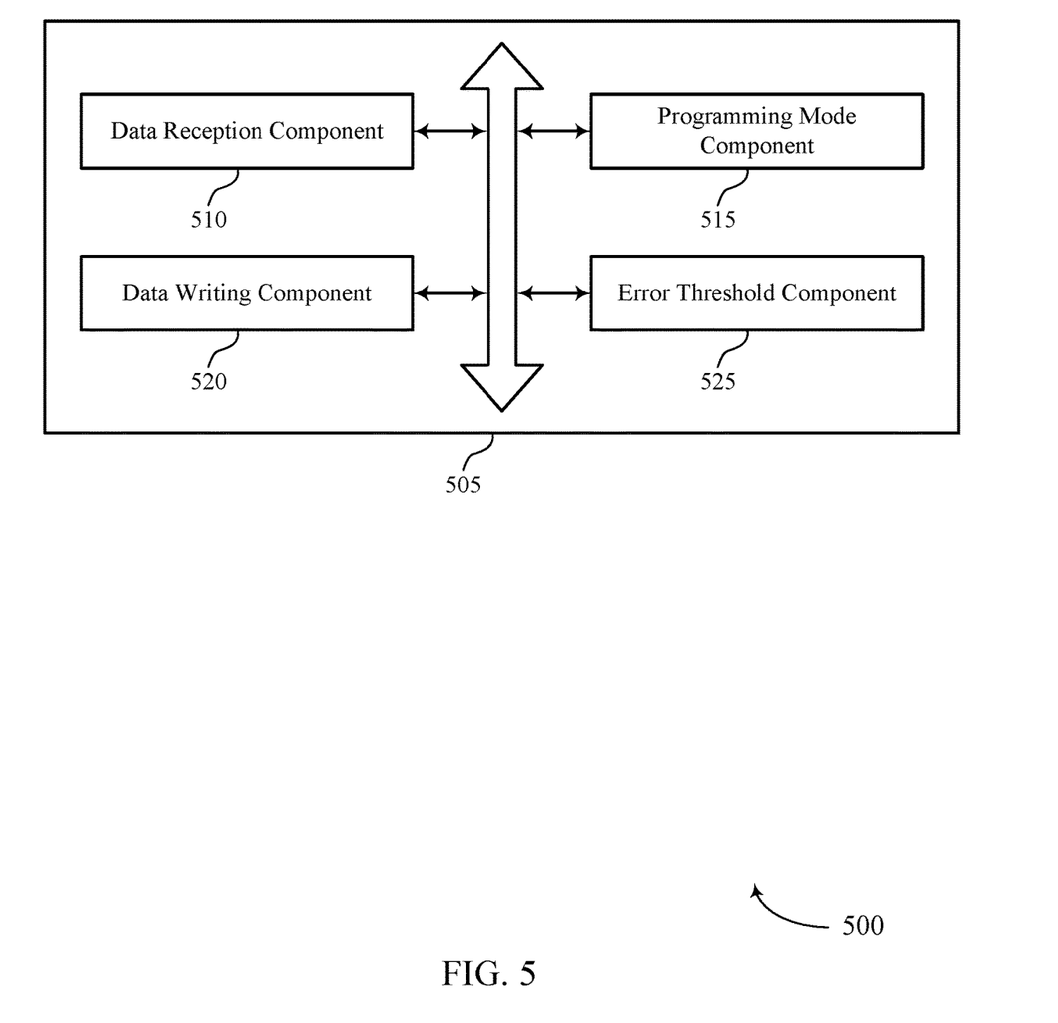
FIG. 5 shows a block diagram of a memory device that supports techniques for data programming in accordance with examples as disclosed herein.

FIG. 5 shows a block diagram 500 of a memory system 505 that supports techniques for data programming in accordance with examples as disclosed herein. The memory system 505 may be an example of aspects of a memory system as described with reference to FIGS. 1-4. The memory system 505 may include a data reception component 510, a programming mode component 515, a data writing component 520, and an error threshold component 525. Each of these modules may communicate, directly or indirectly, with one another (e.g., via one or more buses).

The data reception component 510 may receive data to write to a memory device configured to operate using a first programming mode with a first error rate or a second programming mode with a second error rate higher than the first error rate. In some cases, the first programming mode uses a first pulse having a first voltage level and a first duration to write a logic state to a memory cell and uses feedback information to store individual logic states in individual memory cells. In some cases, the second programming mode uses a second pulse having a second voltage level higher than the first voltage level and a second duration longer than the first duration to write the logic state to the memory cell and omits use of the feedback information to store the individual logic states in the individual memory cells. In some cases, the memory device includes a NAND memory device. In some cases, the second error rate may be based on a failure rate of a RAIN.

The programming mode component 515 may determine to write the data to the memory device using the second programming mode based on receiving the data. In some examples, the programming mode component 515 may receive, from a source external to the memory system, a write command that includes an indication to write the data to the memory device using the second programming mode. In some examples, the programming mode component 515 may determine to use the second programming mode to write the data to the memory device based on a configuration of the memory system.

The data writing component 520 may write the data to the memory device using the second programming mode based on the determining. In some examples, the data writing component 520 may identify a first subset of the data to write to the memory device at a first time based on determining to write the data to the memory device using the second programming mode. In some examples, the data writing component 520 may write the first subset of the data to the memory device at the first time using the second programming mode. In some examples, the data writing component 520 may determine to write the first subset of the data to the memory device using the first programming mode based on determining that the first subset of the data written to the memory device fails to satisfy the error threshold. In some examples, the data writing component 520 may write the first subset of the data to the memory device using the first programming mode based on the determining. In some cases, the memory system further includes a register configured to store a size of the first subset of the data, where writing the first subset is based on the size.

In some examples, the data writing component 520 may identify a second subset of the data to write to the memory device at a second time after the first time based on determining that the first subset of the data written to the memory device satisfies the error threshold. In some examples, the data writing component 520 may write the second subset of the data to the memory device at the second time using the second programming mode.

In some examples, the data writing component 520 may terminate writing the data to the memory device based on determining that the data written to the memory device satisfies the error threshold. In some examples, the data writing component 520 may determine to write at least a portion of the data to the memory device using the first programming mode based on determining that the data written to the memory device fails to satisfy the error threshold. In some examples, the data writing component 520 may write the at least the portion of the data to the memory device using the first programming mode based on the determining.

In some examples, writing the data to the memory device using the first programming mode includes performing a data verification procedure for each memory cell used when writing the data to the memory device.

The error threshold component 525 may determine whether the data written to the memory device satisfies an error threshold after writing the data and based on using the second programming mode to write the data. In some examples, the error threshold component 525 may determine whether the first subset of the data written to the memory device satisfies the error threshold after writing the first subset of the data and based on using the second programming mode to write the first subset of the data. In some examples, the error threshold component 525 may determine whether the second subset of the data written to the memory device satisfies the error threshold after writing the second subset of the data and based on using the second programming mode to write the second subset of the data.

Figure 6:
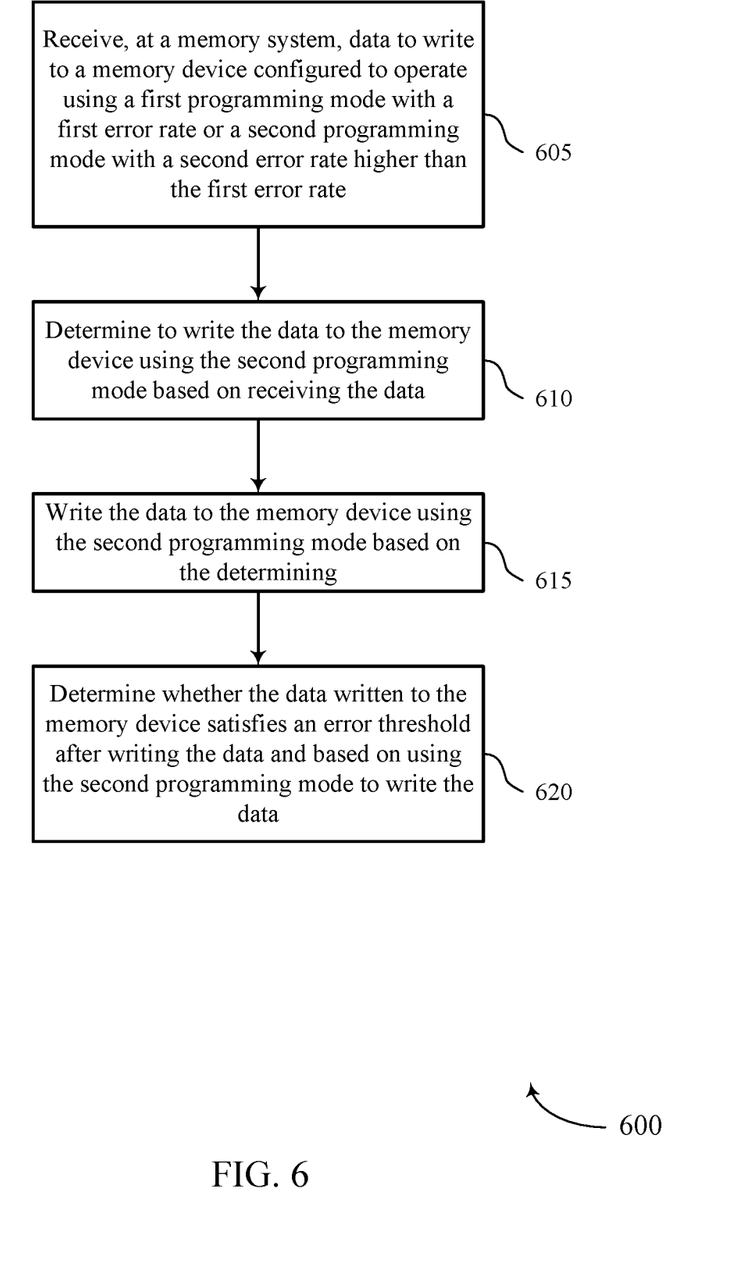
FIG. 6 shows a flowchart illustrating a method or methods that support techniques for data programming in accordance with examples as disclosed herein.

FIG. 6 shows a flowchart illustrating a method or methods 600 that supports techniques for data programming in accordance with examples as disclosed herein. The operations of method 600 may be implemented by a memory system or its components as described herein. For example, the operations of method 600 may be performed by a memory system as described with reference to FIG. 5. In some examples, a memory system may execute a set of instructions to control the functional elements of the memory system to perform the described functions. Additionally or alternatively, a memory system may perform aspects of the described functions using special-purpose hardware.

At 605, the memory system may receive data to write to a memory device configured to operate using a first programming mode with a first error rate or a second programming mode with a second error rate higher than the first error rate. The operations of 605 may be performed according to the methods described herein. In some examples, aspects of the operations of 605 may be performed by a data reception component as described with reference to FIG. 5.

At 610, the memory system may determine to write the data to the memory device using the second programming mode based on receiving the data. The operations of 610 may be performed according to the methods described herein. In some examples, aspects of the operations of 610 may be performed by a programming mode component as described with reference to FIG. 5.

At 615, the memory system may write the data to the memory device using the second programming mode based on the determining. The operations of 615 may be performed according to the methods described herein. In some examples, aspects of the operations of 615 may be performed by a data writing component as described with reference to FIG. 5.

At 620, the memory system may determine whether the data written to the memory device satisfies an error threshold after writing the data and based on using the second programming mode to write the data. The operations of 620 may be performed according to the methods described herein. In some examples, aspects of the operations of 620 may be performed by an error threshold component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for receiving, at a memory system, data to write to a memory device configured to operate using a first programming mode with a first error rate or a second programming mode with a second error rate higher than the first error rate, determining to write the data to the memory device using the second programming mode based on receiving the data, writing the data to the memory device using the second programming mode based on the determining, and determining whether the data written to the memory device satisfies an error threshold after writing the data and based on using the second programming mode to write the data.

In some examples of the method 600 and the apparatus described herein, the first programming mode uses a first pulse having a first voltage level and a first duration to write a logic state to a memory cell and uses feedback information to store individual logic states in individual memory cells, and the second programming mode uses a second pulse having a second voltage level higher than the first voltage level and a second duration longer than the first duration to write the logic state to the memory cell and omits use of the feedback information to store the individual logic states in the individual memory cells.

Some examples of the method 600 and the apparatus described herein may further include operations, features, means, or instructions for receiving, from a source external to the memory system, a write command that includes an indication to write the data to the memory device using the second programming mode.

Some examples of the method 600 and the apparatus described herein may further include operations, features, means, or instructions for determining to use the second programming mode to write the data to the memory device based on a configuration of the memory system.

Some examples of the method 600 and the apparatus described herein may further include operations, features, means, or instructions for identifying a first subset of the data to write to the memory device at a first time based on determining to write the data to the memory device using the second programming mode, writing the first subset of the data to the memory device at the first time using the second programming mode, and determining whether the first subset of the data written to the memory device satisfies the error threshold after writing the first subset of the data and based on using the second programming mode to write the first subset of the data.

In some examples of the method 600 and the apparatus described herein, the memory system further includes a register configured to store a size of the first subset of the data, where writing the first subset may be based on the size.

Some examples of the method 600 and the apparatus described herein may further include operations, features, means, or instructions for determining to write the first subset of the data to the memory device using the first programming mode based on determining that the first subset of the data written to the memory device fails to satisfy the error threshold, and writing the first subset of the data to the memory device using the first programming mode based on the determining.

Some examples of the method 600 and the apparatus described herein may further include operations, features, means, or instructions for identifying a second subset of the data to write to the memory device at a second time after the first time based on determining that the first subset of the data written to the memory device satisfies the error threshold, writing the second subset of the data to the memory device at the second time using the second programming mode, and determining whether the second subset of the data written to the memory device satisfies the error threshold after writing the second subset of the data and based on using the second programming mode to write the second subset of the data.

Some examples of the method 600 and the apparatus described herein may further include operations, features, means, or instructions for terminating writing the data to the memory device based on determining that the data written to the memory device satisfies the error threshold.

Some examples of the method 600 and the apparatus described herein may further include operations, features, means, or instructions for determining to write at least a portion of the data to the memory device using the first programming mode based on determining that the data written to the memory device fails to satisfy the error threshold, and writing the at least the portion of the data to the memory device using the first programming mode based on the determining.

In some examples of the method 600 and the apparatus described herein, writing the data to the memory device using the first programming mode may include operations, features, means, or instructions for performing a data verification procedure for each memory cell used when writing the data to the memory device.

In some examples of the method 600 and the apparatus described herein, the memory device includes a NAND memory device. In some examples of the method 600 and the apparatus described herein, the second error rate may be based on a failure rate of a RAIN.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include receive, at a memory system, data to write to a memory device configured to operate using a first programming mode with a first error rate or a second programming mode with a second error rate higher than the first error rate, determine to write the data to the memory device using the second programming mode based on receiving the data, write the data to the memory device using the second programming mode based on the determining, and determine whether the data written to the memory device satisfies an error threshold after writing the data and based on using the second programming mode to write the data.

In some examples, the first programming mode uses a first pulse having a first voltage level and a first duration to write a logic state to a memory cell and uses feedback information to store individual logic states in individual memory cells, and the second programming mode uses a second pulse having a second voltage level higher than the first voltage level and a second duration longer than the first duration to write the logic state to the memory cell and omits use of the feedback information to store the individual logic states in the individual memory cells.

Some examples may further include receiving, from a source external to the memory system, a write command that includes an indication to write the data to the memory device using the second programming mode.

Some examples may further include determining to use the second programming mode to write the data to the memory device based on a configuration of the memory system.

Some examples may further include identifying a first subset of the data to write to the memory device at a first time based on determining to write the data to the memory device using the second programming mode, write the first subset of the data to the memory device at the first time using the second programming mode, and determine whether the first subset of the data written to the memory device satisfies the error threshold after writing the first subset of the data and based on using the second programming mode to write the first subset of the data.

In some examples, the memory system further includes a register configured to store a size of the first subset of the data, where writing the first subset may be based on the size.

Some examples may further include determining to write the first subset of the data to the memory device using the first programming mode based on determining that the first subset of the data written to the memory device fails to satisfy the error threshold, and write the first subset of the data to the memory device using the first programming mode based on the determining.

Some examples may further include identifying a second subset of the data to write to the memory device at a second time after the first time based on determining that the first subset of the data written to the memory device satisfies the error threshold, write the second subset of the data to the memory device at the second time using the second programming mode, and determine whether the second subset of the data written to the memory device satisfies the error threshold after writing the second subset of the data and based on using the second programming mode to write the second subset of the data.

Some examples may further include terminating writing the data to the memory device based on determining that the data written to the memory device satisfies the error threshold.

Some examples may further include determining to write at least a portion of the data to the memory device using the first programming mode based on determining that the data written to the memory device fails to satisfy the error threshold, and write the at least the portion of the data to the memory device using the first programming mode based on the determining.

In some examples, the instructions to write the data to the memory device using the first programming mode may be executable by the processor to cause the apparatus to perform a data verification procedure for each memory cell used when writing the data to the memory device. In some examples, the memory device includes a NAND memory device. In some examples, the second error rate may be based on a failure rate of a RAIN.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a memory device configured to operate using a first programming mode with a first error rate or a second programming mode with a second error rate higher than the first error rate; and
   a control component coupled with the memory device and configured to cause the apparatus to:
      receive data to write to the memory device;
      determine to write the data to the memory device using the second programming mode based at least in part on receiving the data;
      write a respective portion of the data to each of a plurality of memory cells of the memory device using the second programming mode based at least in part on the determining; and
      determine whether the data written to the memory device satisfies an error threshold after writing the data to the plurality of memory cells and based at least in part on using the second programming mode to write the data.

2. The apparatus of claim 1, wherein:
   the first programming mode uses a first pulse having a first voltage level and a first duration to write a logic state to a memory cell and uses feedback information to store individual logic states in individual memory cells; and
   the second programming mode uses a second pulse having a second voltage level higher than the first voltage level and a second duration longer than the first duration to write the logic state to the memory cell and omits use of the feedback information to store the individual logic states in the individual memory cells.

3. The apparatus of claim 1, wherein the control component is further configured to cause the apparatus to:
   receive, from a source external to the apparatus, a write command that comprises an indication to write the data to the memory device using the second programming mode.

4. The apparatus of claim 1, wherein the control component is further configured to cause the apparatus to:
   determine to use the second programming mode to write the data to the plurality of memory cells of the memory device based at least in part on a configuration of the apparatus.

5. The apparatus of claim 1, wherein the control component is further configured to cause the apparatus to:
   identify a first subset of the data to write to the memory device at a first time based at least in part on determining to write the data to the memory device using the second programming mode;
   write the first subset of the data to the memory device at the first time using the second programming mode; and
   determine whether the first subset of the data written to the memory device satisfies the error threshold after writing the first subset of the data and based at least in part on using the second programming mode to write the first subset of the data.

6. The apparatus of claim 5, wherein the apparatus further comprises:
   a register configured to store a size of the first subset of the data, wherein writing the first subset is based at least in part on the size.

7. The apparatus of claim 5, wherein the control component is further configured to cause the apparatus to:
   determine to write the first subset of the data to the memory device using the first programming mode based at least in part on determining that the first subset of the data written to the memory device fails to satisfy the error threshold; and
   write the first subset of the data to the memory device using the first programming mode based at least in part on the determining.

8. The apparatus of claim 5, wherein the control component is further configured to cause the apparatus to:
   identify a second subset of the data to write to the memory device at a second time after the first time based at least in part on determining that the first subset of the data written to the memory device satisfies the error threshold;

write the second subset of the data to the memory device at the second time using the second programming mode; and determine whether the second subset of the data written to the memory device satisfies the error threshold after writing the second subset of the data and based at least in part on using the second programming mode to write the second subset of the data.

9. The apparatus of claim 1, wherein the control component is further configured to cause the apparatus to:

terminate writing the data to the memory device based at least in part on determining that the data written to the plurality of memory cells of the memory device satisfies the error threshold.

10. The apparatus of claim 1, wherein the control component is further configured to cause the apparatus to:

determine to write at least a portion of the data to the memory device using the first programming mode based at least in part on determining that the data written to the memory device using the second programming mode fails to satisfy the error threshold; and write the at least the portion of the data to the memory device using the first programming mode based at least in part on the determining.

11. The apparatus of claim 1, wherein writing the data to the memory device using the first programming mode comprises performing a first data verification procedure for each memory cell used when writing the data to the memory device, and wherein writing the data to the memory device using the second programming mode comprises performing a second data verification procedure for the plurality of memory cells after writing the data to the plurality of memory cells.

12. The apparatus of claim 1, wherein the memory device comprises a not-AND (NAND) memory device.

13. The apparatus of claim 1, wherein the second error rate is based at least in part on a failure rate of a redundant array of independent nodes (RAIN).

14. A non-transitory computer-readable medium storing code comprising instructions, which when executed by a processor of an electronic device, cause the electronic device to:

receive data to write to a memory device configured to operate using a first programming mode with a first error rate or a second programming mode with a second error rate higher than the first error rate;

determine to write the data to the memory device using the second programming mode based at least in part on receiving the data;

write a respective portion of the data to each of a plurality of memory cells of the memory device using the second programming mode based at least in part on the determining; and determine whether the data written to the memory device satisfies an error threshold after writing the data to the plurality of memory cells and based at least in part on using the second programming mode to write the data.

15. The non-transitory computer-readable medium of claim 14, wherein:

the first programming mode uses a first pulse having a first voltage level and a first duration to write a logic state to a memory cell and uses feedback information to store individual logic states in individual memory cells; and the second programming mode uses a second pulse having a second voltage level higher than the first voltage level and a second duration longer than the first duration to write the logic state to the memory cell and omits use of the feedback information to store the individual logic states in the individual memory cells.

16. The non-transitory computer-readable medium of claim 14, wherein the instructions, when executed by the processor of the electronic device, further cause the electronic device to:

receive, from a source external, a write command that comprises an indication to write the data to the memory device using the second programming mode.

17. The non-transitory computer-readable medium of claim 14, wherein the instructions, when executed by the processor of the electronic device, further cause the electronic device to:

determine to use the second programming mode to write the data to the plurality of memory cells of the memory device based at least in part on a configuration of the electronic device.

18. The non-transitory computer-readable medium of claim 14, wherein the instructions, when executed by the processor of the electronic device, further cause the electronic device to:

identify a first subset of the data to write to the memory device at a first time based at least in part on determining to write the data to the memory device using the second programming mode;

write the first subset of the data to the memory device at the first time using the second programming mode; and determine whether the first subset of the data written to the memory device satisfies the error threshold after writing the first subset of the data and based at least in part on using the second programming mode to write the first subset of the data.

19. A method performed by a memory system, the method comprising:

receiving data to write to a memory device configured to operate using a first programming mode with a first error rate or a second programming mode with a second error rate higher than the first error rate;

determining to write the data to the memory device using the second programming mode based at least in part on receiving the data;

writing respective portions of the data to each of a plurality of memory cells of the memory device using the second programming mode based at least in part on the determining; and determining whether the data written to the memory device satisfies an error threshold after writing the data to the plurality of memory cells and based at least in part on using the second programming mode to write the data.

20. The method of claim 19, wherein:

the first programming mode uses a first pulse having a first voltage level and a first duration to write a logic state to a memory cell and uses feedback information to store individual logic states in individual memory cells; and the second programming mode uses a second pulse having a second voltage level higher than the first voltage level and a second duration longer than the first duration to write the logic state to the memory cell and omits use of the feedback information to store the individual logic states in the individual memory cells.

* * * * *